United States Patent [19]
Mogi

[11] 4,079,320
[45] Mar. 14, 1978

[54] METHOD OF AND APPARATUS FOR TUNING AN AFT-CONTROLLED CHANNEL SELECTING APPARATUS TO A DESIRED FREQUENCY

[75] Inventor: Takao Mogi, Tokyo, Japan

[73] Assignee: Sony Corporation, Tokyo, Japan

[21] Appl. No.: 743,523

[22] Filed: Nov. 19, 1976

[30] Foreign Application Priority Data

Nov. 22, 1975 Japan ................. 50-140571

[51] Int. Cl.$^2$ ............................................. H04B 1/16
[52] U.S. Cl. .................................. 325/420; 325/464; 334/16; 358/195
[58] Field of Search ............... 325/418, 420, 421, 422, 325/423, 335, 453, 464, 468; 334/15, 16; 358/191, 195

[56] References Cited

U.S. PATENT DOCUMENTS

| | | | |
|---|---|---|---|
| 3,715,687 | 2/1973 | Solender | 325/453 |
| 3,968,440 | 7/1976 | Ehni | 325/464 |

*Primary Examiner*—Robert L. Griffin
*Assistant Examiner*—Marc E. Bookbinder

*Attorney, Agent, or Firm*—Lewis H. Eslinger; Alvin Sinderbrand

[57] ABSTRACT

A method of and apparatus for tuning an AFT-controlled channel selecting apparatus of the type having a storage device for storing digital representations corresponding to predetermined channel frequencies from which a selected representation is read out and converted to a control voltage which is applied to a controllable tuning element included in an electronic tuner. When the control voltage is applied, generally it experiences a gradual increase in magnitude until its predetermined control voltage level is attained. The automatic fine tuning (AFT) circuit may pull in a frequency corresponding to the instantaneous level of the control voltage during the gradual increase in magnitude thereof. To avoid tuning the electronic tuner to such an unwanted pulled-in frequency, the AFT operation is carried out at a relatively slow rate when the tuning of the tuner approaches the frequency corresponding to the read out representation and then at a relatively fast rate when the tuner is tuned to a frequency that deviates from the desired frequency within a predetermined range.

10 Claims, 24 Drawing Figures

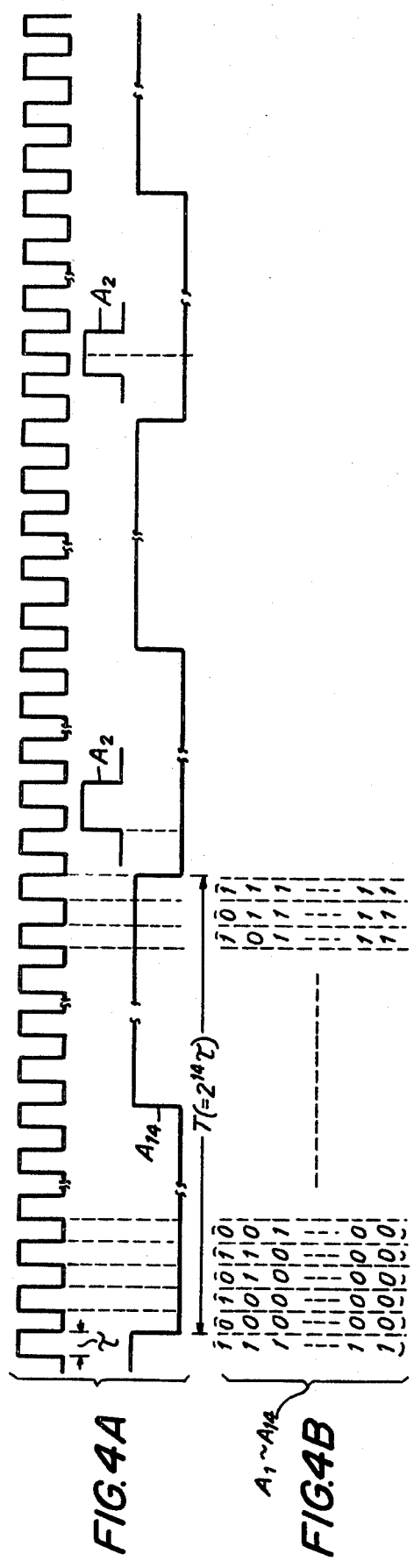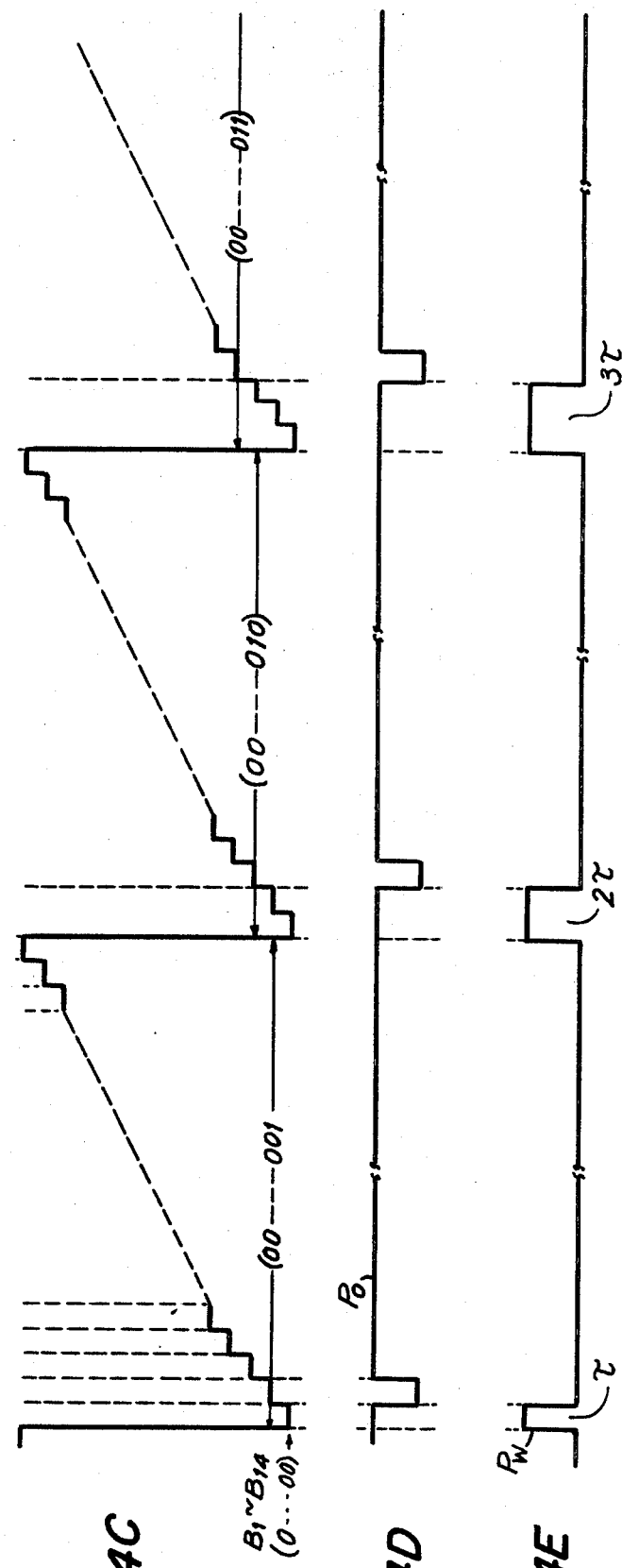
FIG.4A FIG.4B FIG.4C FIG.4D FIG.4E

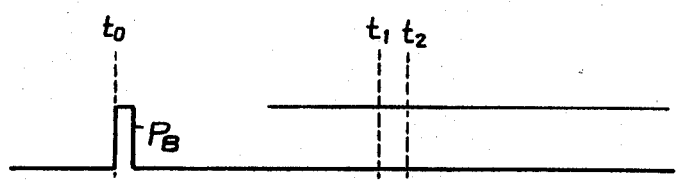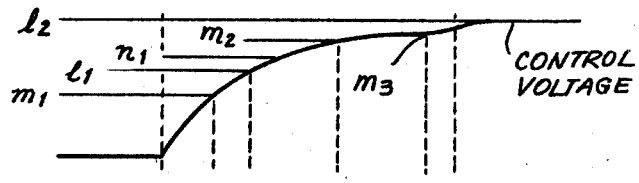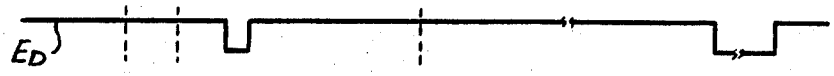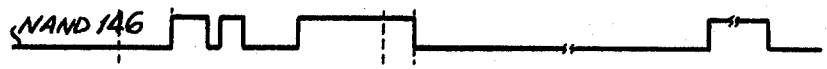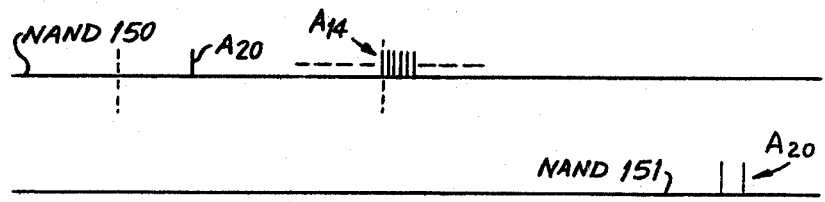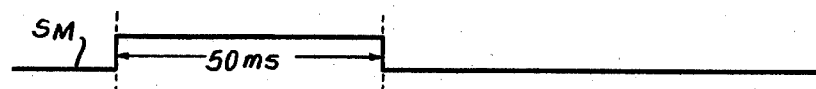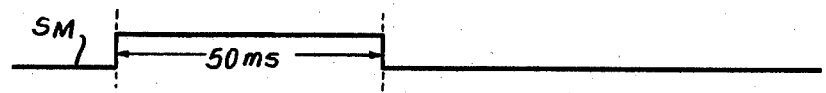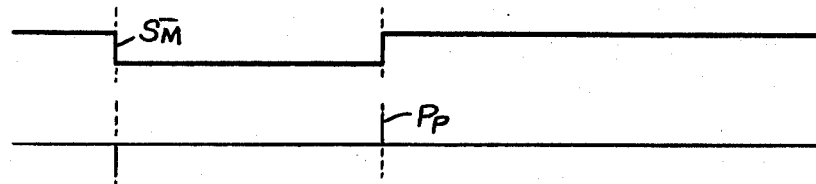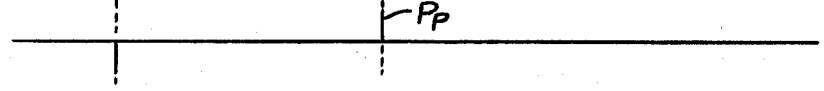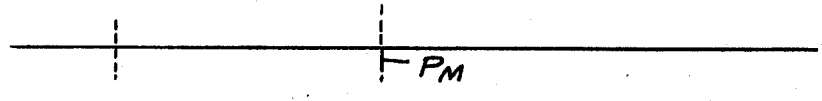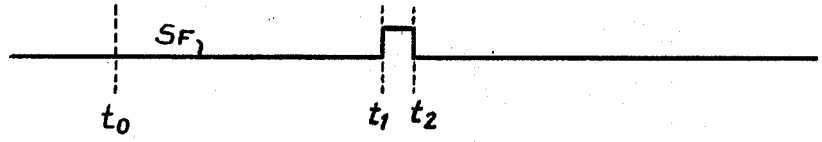

METHOD OF AND APPARATUS FOR TUNING AN AFT-CONTROLLED CHANNEL SELECTING APPARATUS TO A DESIRED FREQUENCY

BACKGROUND OF THE INVENTION

This invention relates to an electronic tuner of a type used in programmable channel selecting apparatus and, more particularly, to a method of and apparatus for automatically fine tuning such an electronic tuner to a selected frequency without pulling in an unwanted frequency.

Electronic tuners, such as a tuner used to select a particular channel in a television receiver or to select a particular station in, for example, an FM radio receiver, are known wherein a voltage-controlled variable reactance element, such as a varactor or variable capacitance diode, is supplied with a selected control voltage. Such tuning element exhibits a particular reactance representing the channel or station to which the tuner is to be tuned in accordance with the magnitude of the control voltage applied thereto. For example, the higher the magnitude of the control voltage, the higher the frequency to which the tuner is tuned.

An electronic tuner with such a voltage-controlled tuning element can, advantageously, be subjected to an automatic fine tuning (AFT) operation. Typically, this operation is performed by detecting the actual frequency to which the electronic tuner then is tuned, sensing the deviation between this instantaneous frequency and a predetermined frequency, and then adjusting the control voltage applied to the voltage-controlled tuning element in a direction to pull in the predetermined frequency. There are, however, some disadvantages attending the use of an AFT-controlled electronic tuner in a television receiver. For example, if the tuning condition of a television receiver is to be changed from a channel having a lower carrier frequency, such as channel 2, to a channel having a higher carrier frequency, such as channel 5, there is the possibility that as the magnitude of the applied control voltage increases, the AFT operation may pull in an unwanted channel whose carrier frequency lies between the lower and higher channel frequencies. That is, as the control voltage magnitude increases, it may, at some point, have an instantaneous magnitude corresponding to channel 3 or channel 4, and the AFT operation may pull in this channel. Similarly, if the television receiver is pre-conditioned to be tuned to a predetermined channel when the power supply for the electronic tuner first is energized, the AFT operation may pull in an unwanted channel, or tune the tuner to an unwanted frequency, while the power supply operating voltage, and thus the tuner-controlling voltage, increases. This possibility of pulling in an erroneous frequency is further complicated by the fact that, in typical television signal transmissions, the video information for a particular channel is modulated onto one carrier frequency and the audio information for that same channel is modulated onto a higher carrier frequency. Consequently, the AFT operation may lock the electronic tuner onto the sound information carrier frequency of an adjacent, lower channel.

It has been proposed that this erroneous pull-in result can be avoided by completely suppressing or stopping the AFT operation for a certain duration of time after the tuner power supply first is energized or after a new channel-frequency is selected, as described in U.S. Pat. No. 3,806,817. However, since the AFT operation generally is a slow, or low frequency, technique, it is preferred not to suppress or stop it, especially when the AFT circuit is used with a programmable type of electronic tuner, such as that disclosed in copending application Ser. No. 716,655, filed Aug. 23, 1976, and assigned to the assignee of the present invention. In such a programmable type of electronic tuner, various representations, such as digital representations, of individual VHF and/or UHF channels are stored. A selected representation is read out of an addressed storage location and is converted into a control voltage for application to the voltage-controlled tuning element. Nevertheless, in this type of electronic tuner, if the AFT operation is performed at a low rate, an unusually long time may be required for satisfactory operation to be completed; whereas if it is performed at a high rate, the AFT operation may pull in an unwanted frequency as the control voltage level gradually increases.

OBJECTS OF THE INVENTION

Therefore, it is an object of the present invention to provide an improved method and apparatus for tuning an AFT-controlled electronic tuner to a selected frequency.

Another object of this invention is to provide a method of and apparatus for avoiding an AFT-controlled electronic tuner from being tuned, or pulled in, to an unwanted frequency.

A still further object of this invention is to provide a method of and apparatus for tuning an AFT-controlled electronic tuner to a desired frequency when the tuner power supply first is energized or when the desired frequency is selected, as during channel change-over, while avoiding an unwanted frequency from being pulled in by the AFT operation.

An additional object of this invention is to provide an improved method of and apparatus for tuning an AFT-controlled electronic tuner to a desired frequency without suppressing or stopping the AFT operation during an initial power supply energizing period or following a channel change-over operation.

Yet another object of this invention is to provide a method of and apparatus for tuning an AFT-controlled channel selecting apparatus to a selected channel-frequency rapidly and accurately in response to a channel selection.

A further object of this invention is to provide a method of and apparatus for controlling an AFT operation in a channel selecting apparatus to be carried out at a relatively low rate while the tuning condition of the channel selecting apparatus approaches a selected frequency and at a relatively high rate when such tuning condition is within a predetermined range of the selected frequency.

Various other objects, advantages and features of this invention will become readily apparent from the ensuing detailed description, and the novel features will be particularly pointed out in the appended claims.

SUMMARY OF THE INVENTION

In accordance with this invention, a method of and apparatus for tuning an AFT-controlled channel selecting apparatus of the type having a storage device for storing digital representations corresponding to predetermined channel-frequencies from which a selected representation is read out and converted to a gradually increasing control voltage to be applied to a tuning element is provided, comprising varying the read out representation at a slow rate in response to a detected deviation between the frequency to which the apparatus is tuned and a predetermined frequency when the tuning condition of the apparatus approaches the selected frequency, and varying the read out representation at a fast rate in response to such detected frequency deviation when the tuning condition is within a predetermined range of the selected frequency.

BRIEF DESCRIPTION OF THE DRAWINGS

The following detailed description, given by way of example, will best be understood in conjunction with the accompanying drawings in which:

FIGS. 4A–4E are waveform diagrams that are helpful in explaining the operation of the electronic tuner shown in FIG. 1;

FIGS. 7A–7L are waveform diagrams to which reference will be made in explaining the operation of a preferred embodiment of an AFT control circuit shown in FIG. 1 and used with the illustrated channel selecting apparatus.

DETAILED DESCRIPTION OF A PREFERRED EMBODIMENT

Although the technique of the present invention by which the AFT operation is controlled can be used with various types of electronic tuners, it will be particularly described in the environment of channel selecting apparatus that can be used in a television receiver and that can be programmed by a user to receive selected VHF and/or UHF frequencies.

Programmable Electronic Tuner

Figure 1:
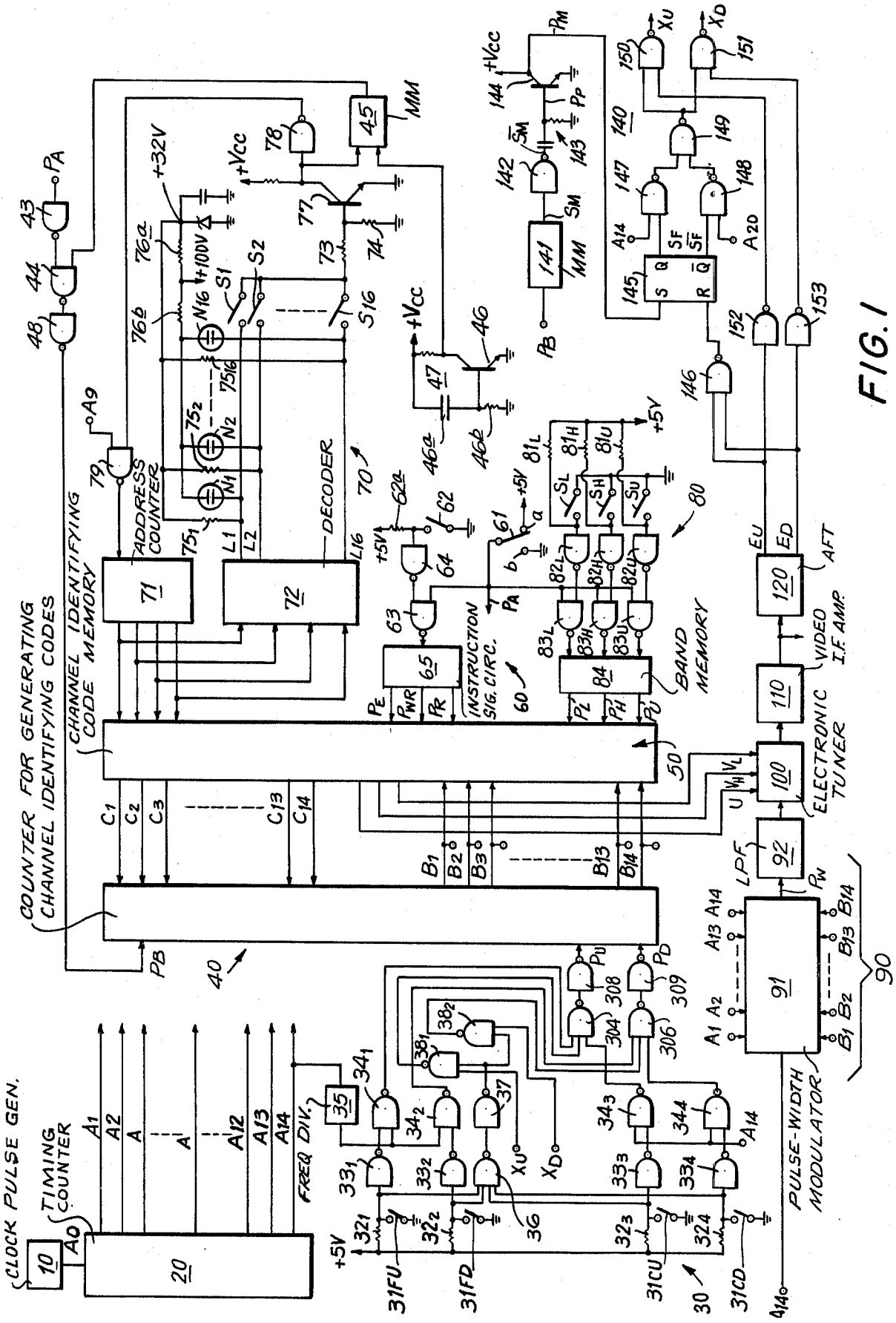
FIG. 1 is a block diagram illustrating one embodiment of channel selecting apparatus wherein the present invention finds ready application.

Referring to FIG. 1, one embodiment of channel selecting apparatus comprises a clock pulse generator 10 that supplies clock pulses $A_o$ to a timing counter 20, the timing counter being a conventional counter responsive to clock pulses $A_o$ to produce a recirculating timing code $A_1, A_2, A_3 \ldots A_{14}$. A sweep pulse generating circuit 30 is manually controllable to selectively produce up-sweep pulses $P_U$ or down-sweep pulses $P_D$ in response to timing pulses $A_{14}$ produced by timing counter 20. An up-down counter 40 is provided to count the sweep pulses $P_U$ or $P_D$ in a programming mode of the apparatus to establish channel identifying digital codes $B_1, B_2, B_3 \ldots B_{14}$ corresponding to the changing counts of counter 40. These channel identifying codes may be selectively written at selected addresses in a memory 50. A memory control circuit 60 is adapted to selectively establish the programming mode of operation or a channel selecting mode in which a previously programmed channel is selected, as by reading out a channel identifying digital code previously written or stored at a selected address in memory 50, as indicated at $C_1, C_2, C_3 \ldots C_{14}$, with such read out code being applied to counter 40 for setting the counter to this count. A manually controllable address selecting circuit 70 is adapted to activate a selected address in memory 50 either for the writing in of a selected channel identifying code at such address or the reading out from such address of a previously stored channel identifying code. A band indicating signal forming circuit 80 is operable in the programming mode of operation to produce a signal indicating the band of the channel indicating code then being written into a selected address of memory 50. The band indicating signal also is written into the respective address.

The channel selecting apparatus shown in FIG. 1 also includes a digital-to-analog converter 90 which provides an analog control voltage for the variable reactance device, such as a varactor, of a selected band in an electronic tuner 100 in correspondence to the count of counter 40 established by a channel identifying digital code selectively read out of memory 50 in a channel selecting mode of the apparatus, or in correspondence to the changing counts of counter 40 produced when the counter counts sweep pulses from generating circuit 30 in the programming mode of the apparatus. A video intermediate frequency amplifier 110 receives the tuned frequency output of tuner 100 and operates in typical manner to supply its output to a video detector circuit (not shown).

The output of IF amplifier 110 also is supplied to an automatic fine tuning (AFT) circuit 120 for discriminating, or detecting, the deviation between the carrier in the IF output and a predetermined carrier frequency to produce an AFT voltage from which outputs $E_U$ and $E_D$ are derived, as will be described below. These outputs indicate that the channel identifying digital code in counter 40 should be incremented or decremented so as to correspondingly vary the analog control voltage in a direction whereby the tuned frequency output of tuner 100 is corrected to attain the precise predetermined carrier frequency. This results in properly tuning the electronic tuner to a correct broadcast channel.

Outputs $E_U$ and $E_D$ are applied to a control circuit 140 from which AFT control pulses $X_U$ and $X_D$ are produced and supplied to sweep pulse generating circuit 30 for providing sweep pulses that are counted by counter 40. Hence, the channel identifying code applied by the counter to converter 90 is modified to correct the frequency to which the tuner then is tuned, for achieving a desired AFT operation.

In the channel selecting apparatus as generally described above, the clock pulse $A_o$ from generator 10 may have a frequency of, for example, 4 MHz resulting in a period $\tau$ of 0.25 μsec. In the timing counter 20, clock pulses $A_o$ are counted to produce timing pulses $A_1$ to $A_{14}$. The frequency of a given timing pulse is one-half the frequency of its preceding pulse so that a sequence of frequency-halved pulses range from the pulses $A_1$ having a period of 0.5 μsec. and a pulse width of 0.25 μsec., to the pulses $A_{14}$ having a period of 4.096 m.sec. and a pulse width of 2.048 m.sec. The timing pulses $A_1, A_2 \ldots A_{14}$ thus form a 14-bit recirculating timing code. It will be apparent that such 14-bit circulating digital code changes its state $2^{14}$ times, that is, 16,384 times, within the recirculating or timing period of $T = 2^{14} = 4.096$ m.sec., as depicted in FIGS. 4A and 4B.

In the sweep pulse generating circuit 30 as shown in FIG. 1, a fine up-sweep switch 31FU, a fine down-sweep switch 31FD, a coarse up-sweep switch 31CU and a coarse down-sweep switch 31CD are connected in series circuits with respective resistors $32_1$, $32_2$, $32_3$ and $32_4$, and such series circuits are connected in parallel between a voltage source and ground. The switches 31FU, 31FD, 31CU and 31CD are normally open, as shown, to provide signals at a relatively high level, hereinafter used to designate a binary "1", at the junctions of such switches with the respective resistors $32_1$, $32_2$, $32_3$ and $32_4$. Further, switches 31FU, 31FD, 31CU and 31CD are adapted to be selectively manually displaced to the closed condition thereof for providing a signal at a relatively low level, hereinafter used to designate a binary "0", at the junction of the closed switch with the respective resistor $32_1$–$32_4$. Such binary signals "1" or "0" from switches 31FU, 31FD, 31CU and 31CD are applied through inverters $33_1$, $33_2$, $33_3$ and $33_4$ to NAND circuits $34_1$, $34_2$, $34_3$ and $34_4$, respectively. The binary pulses $A_{14}$ having a period of 4.096 m.sec. are applied from timing counter 20, as coarse sweep pulses, to second inputs of NAND circuits $34_3$ and $34_4$. These timing pulses $A_{14}$ also are applied to a frequency divider 35 so as to be divided, for example, by 64, for providing fine sweep pulses $A_{20}$ having a period of 262.144 m.sec. and such fine sweep pules $A_{20}$ are applied to second inputs of NAND circuits $34_1$ and $34_2$.

The binary signals "1" or "0" from switches 31FU, 31FD, 31CU and 31CD are also all applied to a NAND circuit 36 which has its output connected through an inverter 37 to provide a binary "1" when none of these switches is closed, or a binary "0" when any one switch is closed, which is, in turn, applied to NAND circuits $38_1$ and $38_2$. The NAND circuits $38_1$ and $38_2$ both also have applied thereto the output pulses $X_U$ and $X_D$ from AFT control circuit 140. The outputs of NAND circuits $34_1$ and $38_1$ are applied to a NAND circuit 304, while the outputs of NAND circuits $34_2$ and $38_2$ are similarly applied to a NAND circuit 306. NAND circuit 304 also receives the output of NAND circuit $34_3$; and NAND circuit 306 also receives the output of NAND circuit $34_4$. The outputs of NAND circuits 304 and 306 are respectively applied through inverters 308 and 309 to apply up-sweep pulses $P_U$ and down-sweep pulses $P_D$, respectively, to counter 40.

Figure 2:
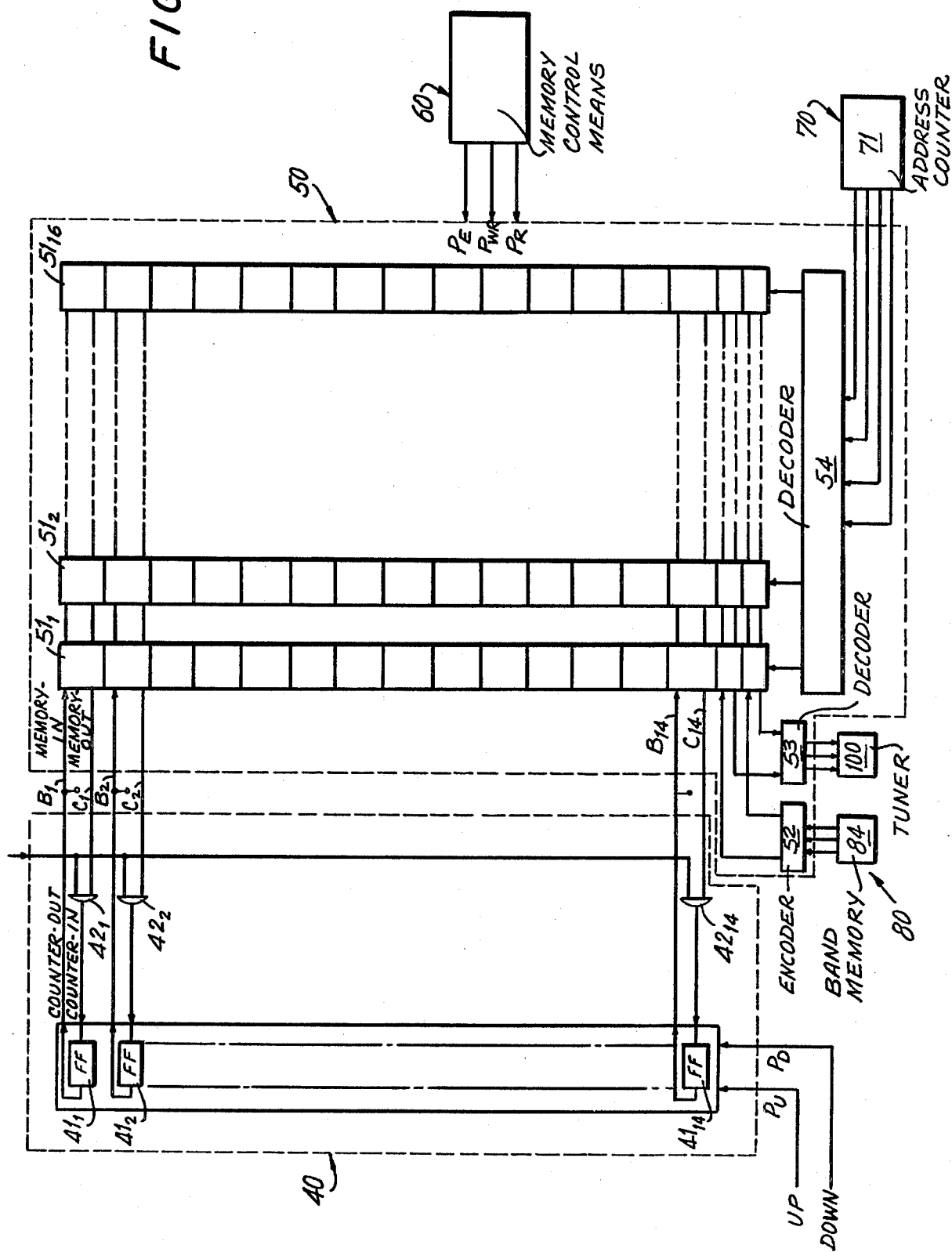
FIG. 2 is a block diagram illustrating, in greater detail, a portion of the electronic tuner of FIG. 1.

As shown schematically in FIG. 2, counter 40 may be a conventional 14-bit up-down counter having 14 flip-flop circuits $41_1$, $41_2$ ... $41_{14}$ whose states are changed sequentially in the up or down direction when counting the up-sweep pulses $P_U$ or the down-sweep pulses $P_D$, respectively, in the programming mode of operation. These changing states establish the respective bits of sequentially changing 14-bit channel identifying codes $B_1$, $B_2$ ... $B_{14}$. In the programming mode of operation, the channel identifying codes are applied from counter 40 to memory 50 for writing or storage of a selected one of such codes at a selectively activated address in the memory, and the channel identifying codes are also applied from counter 40 to digital-to-analog converter 90 for providing a corresponding control voltage for the varactor in a selected band of electronic tuner 100. Flip-flop circuits $41_1$–$41_{14}$ of counter 40 are further adapted, in the channel selecting mode of operation, to have their respective states established by the respective bits $C_1$–$C_{14}$ of a stored channel identifying code which is read out from a selectively activated address in memory 50 through AND circuits $42_1$–$42_{14}$ when these AND circuits are energized by a load pulse $P_B$ during the channel selecting operation.

As also shown in FIG. 2, memory 50 may be formed of sixteen addressable memory units, or registers, $51_1$, $51_2$ ... $51_{16}$ with the memory at each address being capable of storing 16-bits of digital information, that is, the 14-bits of a selected channel identifying code as determined by counter 40 and 2-bits from an encoder 52 for the band indicating signal received from circuit 80 for indicating whether the channel identified by the 14-bit digital code is a VHF or UHF channel, and, if it is a VHF channel, whether it is a low channel or a high channel in such broadcast band, respectively. Further, the memory 50 is schematically shown to include a decoder 53 which, in the programming and channel selecting modes of operation, receives the 2-bits of digital information representing the band of the channel identified by the 14-bit code that is being written into or read out of the addressed unit 51, to apply a corresponding band identifying signal to electronic tuner 100 for selecting the corresponding VHF or UHF band. Finally, the memory 50 is schematically shown to include a decoder 54 which receives a 4-bit digital code from address selecting circuit 70, as hereinafter described, to address one memory unit $51_1$, $51_2$ ... $51_{16}$ corresponding to the 4-bit address code. Preferably, the memory units of memory 50 are composed of non-volatile cells, such as metal-nitride-oxide-silicon (MNOS) elements, so that the contents thereof, while being electrically alterable, are held unchanged during periods when memory 50 is disconnected from a source of power.

Returning again to FIG. 1, memory control 60 includes a mode change-over switch 61 having a movable contact that is manually actuable to selectively engage fixed contacts $a$ and $b$. Fixed contact $a$ is connected to a voltage source +5V so that, when the movable contact engages contact $a$, the programming mode of operation is established and a signal $P_A$ that is a binary "1" is obtained from switch 61. On the other hand, the fixed contact $b$ of switch 61 is connected to ground so that, when the movable contact engages contact $b$, the channel selecting mode of operation is established and a signal $P_A$ that is a binary "0" is obtained. Memory control 60 further includes a normally open switch 62 which is connected in series with a resistor 62$a$ between a voltage source +5V and ground. The signal $P_A$ from mode change-over switch 61 is shown to be applied to one input of a NAND circuit 63 which has its other input connected through an inverter 64 to switch 62. When switch 62 is in its normally open position, as shown, inverter 64 will produce a binary "0", whereas, when switch 62 is manually closed to effect a write-in operation in the programming mode, inverter 64 will produce a binary "1". The output of NAND circuit 63 is applied to an instruction signal forming circuit 65 which is responsive to a binary "0" to supply an erasing pulse $P_E$ followed by a write-in pulse $P_{WR}$ to the particular memory unit that is being addressed in memory 50 so as to erase the previously stored contents in the addressed memory unit and, thereafter, to write into the addressed memory unit the 14-bit channel identifying code then being received from counter 40 plus the 2-bit code representing the band of the channel identified by the 14-bit code. Instruction signal forming circuit 65 is responsive to a binary "1"0 supplied by NAND circuit 63 to apply a read pulse $P_R$ to memory 50 so as to effect the read out of the contents stored in the memory unit which then is being addressed.

Band indicating signal forming circuit 80 includes normally open switches $S_L$, $S_H$ and $S_U$ which are connected in series with respective resistors $81_L$, $81_H$ and $81_U$ between a voltage source +5V and ground. Switches $S_L$, $S_H$ and $S_U$ are further connected to inverters $82_L$, $82_H$ and $82_U$, respectively, which have their outputs connected to first inputs of NAND circuits $83_L$, $83_H$ and $83_U$, respectively. The second inputs of these NAND circuits receive the signal $P_A$ from mode change-over switch 61 to selectively actuate band memory 84 which, in turn, applies a band indicating signal $P_L$, $P_H$ or $P_U$ to encoder 52 (FIG. 2) in memory 50. In the programming mode of operation, that is, when signal $P_A$ is a binary "1", the output of NAND circuit $83_L$, $83_H$ or $83_U$ is a binary "0" only when the respective switch $S_L$, $S_H$ or $S_U$ is manually closed, representing that the channel identified by the 14-bit code to be written into a selected address in memory 50 is a low VHF channel, a high VHF channel or a UHF channel, respectively.

Address selecting circuit 70 includes a plurality, for example, 16, normally open address selecting switches $S_1, S_2 \ldots S_{16}$ which are each selectively closed for selecting a corresponding one of the 16 addresses or memory units in memory 50 during a programming operation or channel selecting operation. Address selecting circuit 70 further includes neon tubes or other indicators $N_1$, $N_2 \ldots N_{16}$ corresponding to switches $S_1, S_2 \ldots S_{16}$, an address counter 71 which produces a 4-bit addressing code corresponding to the particular switch $S_1$-$S_{16}$ that is closed for addressing the corresponding memory unit in memory 50, and a decoder 72 which receives the coded output of address counter 71 to produce a binary "0" output signal on a respective one of 16 output lines $L_1, L_2 \ldots L_{16}$. The switches $S_1$-$S_{16}$ are connected, at one side, in common, through series resistors 73 and 74 to ground, while the opposite sides of switches $S_1$-$S_{16}$ are connected to lines $L_1$-$L_{16}$, respectively. Further, the lines $L_1$-$L_{16}$ are connected through resistors $75_1$-$75_{16}$, respectively, and a common resistor $76a$ to a voltage source +100V, while the neon tubes or indicators $N_1$-$N_{16}$ are connected between the lines $L_1$-$L_{16}$, respectively, and the same voltage source +100V through a common resistor $76b$.

A switching transistor 77 has its base electrode connected to resistors 73 and 74, its emitter electrode connected to ground and its collector electrode connected to a voltage source $+V_{cc}$ and to an inverter 78. The output of inverter 78 is connected to one input of a NAND circuit 79, the other input of which receives timing pulses $A_9$ produced by timing counter 20 and having a period of 0.128 m.sec. The output of NAND circuit 79 is applied to address counter 71 which counts each binary "0" produced by the NAND circuit.

Load pulse $P_B$ that is applied to AND circuits $42_1$-$42_{14}$ of counter 40 for reading out the channel identifying code $C_1$-$C_{14}$ from an addressed memory unit in memory 50 (FIG. 2), is produced by NAND circuit 44 and supplied through inverter 48 to the AND circuits. One input of NAND circuit 44 is supplied with the signal $P_A$ through inverter 43, and the other input of NAND circuit 44 is connected to the output of a monostable multivibrator 45 which is triggered by a binary "1" at the collector of transistor 77 and also by a binary "1" produced by a power supply turn-on detector 47. When signal $P_A$ is a binary "0", as during the channel selecting mode of operation, and monostable multivibrator 45 is triggered to produce a binary "1" pulse for a predetermined period of, for example, 50 m.sec., load pulse $P_B$ is produced. The load pulse also is produced when the apparatus initially is connected to a power source, or turned on, as detected by circuit 47. That is, when the power supply for the channel selecting apparatus first is turned on, operating voltage $V_{cc}$ gradually increases to correspondingly increase the voltage at the junction defined by capacitor 46a and resistor 46b included in circuit 47 and connected across the power supply terminal. Transistor 46 thus is turned on to lower its collector voltage, and when capacitor 46a then discharges through resistor 46b, the base voltage of transistor 46 falls until it is less than the threshold level necessary to maintain conduction. Transistor 46 then is turned off so that its collector voltage rises to trigger monostable multivibrator 45. Hence, the load pulse $P_B$ is applied to counter 40 so that a particular channel identifying code stored at a predetermined memory unit in memory 50 is read out to counter 40 to enable converter 90 to generate a corresponding control voltage, whereby tuner 100 is tuned to a predetermined channel.

Digital-to-analog converter 90 preferably includes a pulse-width modulator 91 operative to produce a chain of pulses at a predetermined repetition rate with the effective width of the pulses in repetitive timing durations being dependent on the channel identifying code $B_1, B_2 \ldots B_{14}$ obtained from counter 40. The recurring pulses from modulator 91 are supplied through a low-pass filter 92 for providing the analog control voltage for a variable reactance device in electronic tuner 100.

Figure 3:
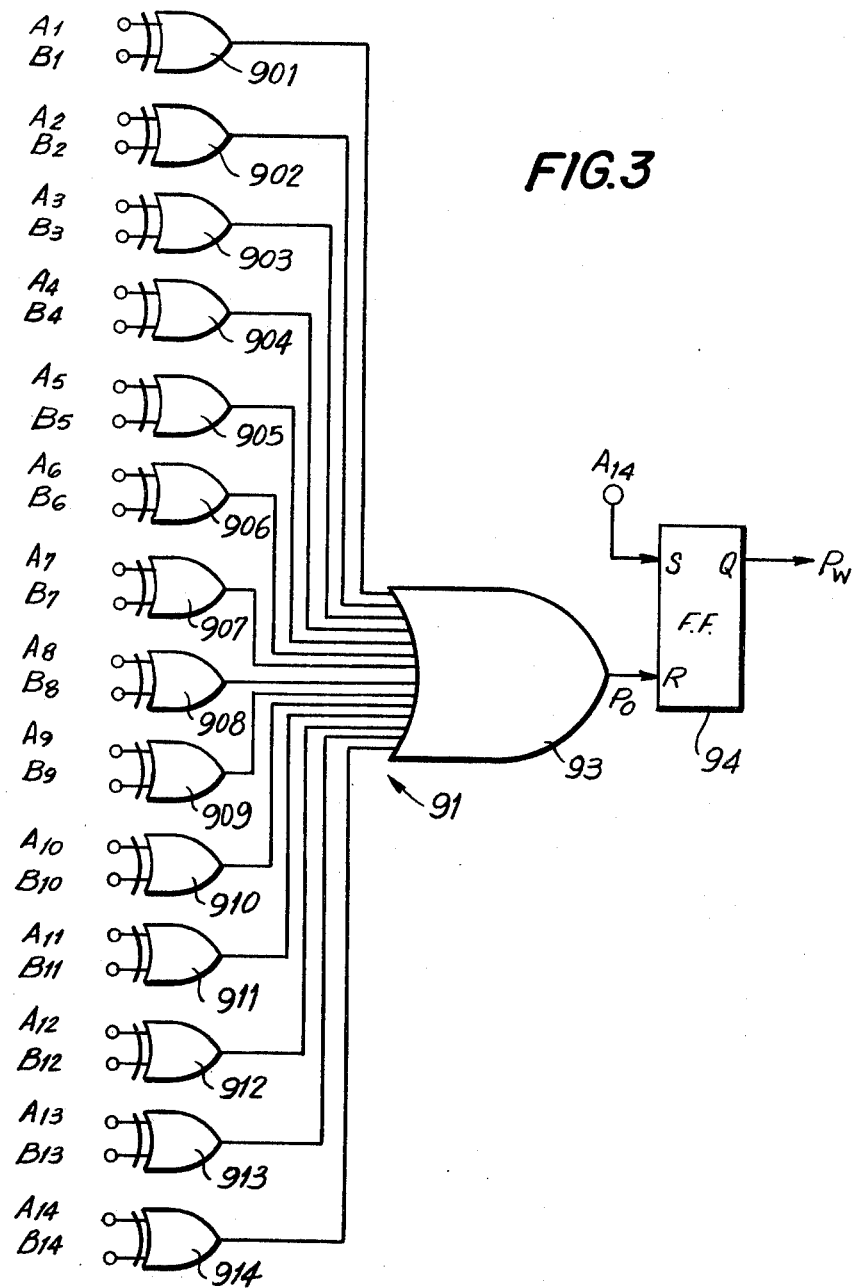
FIG. 3 is a logic diagram illustrating a portion of the control voltage generator used with the electronic tuner of FIG. 1.

One embodiment of pulse width modulator 91 is shown in FIG. 3, including 14 exclusive OR circuits 901, 902 . . . 914 having first and second inputs which respectively receive the timing pulses $A_1, A_2 \ldots A_{14}$ of the recirculating code and the bits $B_1, B_2 \ldots B_{14}$ of the channel identifying code. The outputs of all of the exclusive OR circuits 901-914 are applied through an OR circuit 93 to the reset terminal R of of a flip-flop circuit 94 which has the timing pulse $A_{14}$, whose period is 4.096 m.sec., applied to its set terminal S. Flip-flop circuit 94 is a conventional negative-edge triggered flip-flop circuit adapted to provide a binary "1" output at its output terminal Q, that is, to initiate an output pulse $P_W$ in response to timing pulse $A_{14}$, and to terminate output pulse $P_W$, that is, to return to a binary "0", in response to the falling edge of an output pulse $P_O$ from OR circuit 93.

With reference to FIGS. 4B-4E, an output pulse $P_W$ (FIG. 4E) is initiated when the recirculating code $A_1$, $A_2 \ldots A_{14}$ returns from the state (11111111111111) to the state (00000000000000). So long as the recirculating code is not coincident in level with the channel identifying code ($B_1, B_2 \ldots B_{14}$) then being applied to pulse-width modulator 91, one or more of the exclusive OR circuits 901-914 produces a binary "1" with the result that the output $P_O$ of OR circuit 93 also is a binary "1" (FIG. 4D). Upon the coincidence of all bits of the recirculating code $A_1, A_2 \ldots A_{14}$ with the corresponding bits of the channel identifying code $B_1, B_2 \ldots B_{14}$ during each period T of the recirculating code, the outputs of all of the exclusive OR circuits 901-914 are binary 0's, with the result that the output $P_O$ of OR circuit 93 falls from a binary "1" to a binary "0" so as to reset flip-flop circuit 94 and thereby return the output pulse $P_W$ to a binary "0". Thus, during each recirculating period T of the recirculating code $A_1, A_2 \ldots A_{14}$, output pulse $P_W$ is obtained from flip-flop circuit 94 having a duration extending from the time that the recirculating code $A_1$, $A_2 \ldots A_{14}$ returns from the state (11111111111111) to the state (00000000000000) until the time of coincidence of the recirculating code with the channel identifying code $B_1, B_2 \ldots B_{14}$. Therefore, when the channel identifying code $B_1, B_2 \ldots B_{14}$ applied to pulse-width modulator 91 changes, a corresponding change occurs in the width of the output pulse $P_W$ during each period T of the circulating code.

For example, as shown on the left-hand portions of FIGS. 4A–4E, if the channel identifying code $B_1, B_2 \ldots B_{14}$ applied to pulse-width modulator 91 is (00000000000001), the output pulse $P_W$ produced during each period of the recirculating code $A_1, A_2 \ldots A_{14}$ commences at the beginning of the period, that is, when the recirculating code returns from the state (11111111111111) to the state (00000000000000), and terminates at the commencement of the first pulse $A_1$, at which time the recirculating code (00000000000001) coincides with the channel identifying code (00000000000001) to cause the output $P_O$ of OR circuit 93 to fall from a binary "1" to a binary "0". Thus, the output pulse $P_W$ produced during each period of the recirculating code has a pulse width of $\tau$.

As shown in the middle portion of FIGS. 4A–4E, if the channel identifying code $B_1, B_2 \ldots B_{14}$ is (00000000000010), the coincidence of that channel identifying code with the recirculating code $A_1, A_2 \ldots A_{14}$ occurs, during each period of the recirculating code, at the commencement of pulse $A_2$, so that the resulting output pulse $P_W$ obtained during each period has a width of $2\tau$. Similarly, as shown in the right-hand portions of FIGS. 4A–4E, if the channel identifying code $B_1, B_2 \ldots B_{14}$ is (00000000000011), the coincidence of such channel identifying code with the recirculating code $A_1, A_2 \ldots A_{14}$ during each period of the latter occurs at the time that both pulse $A_1$ and pulse $A_2$ coexist, so that the resulting output pulse $P_W$ obtained during each period has a pulse-width of $3\tau$.

Thus, the output pulses $P_W$ produced by modulator 91 during successive periods T of the recirculating code $A_1, A_2 \ldots A_{14}$ have their pulse-widths determined by the channel identifying code $B_1, B_2 \ldots B_{14}$, and low pass filter 92 smooths such output pulses to deliver an analog, or DC control voltage, having a value that corresponds to the width of pulses $P_W$. This control voltage is applied to tuner 100 for determining the broadcast channel frequency to which the apparatus is tuned.

Returning to FIG. 1, load pulse $P_B$, produced by NAND circuit 44 and inverter 48 also is applied to AFT control circuit 140 for a purpose to be described below. Suffice it to say that the load pulse is used to selectively control the rate at which the AFT operation is carried out during a period of time following the occurrence of the load pulse.

Programming Mode of Operation

When it is desired to program the channel selecting apparatus, that is, to store at the various addresses in memory 50 channel identifying codes corresponding to various channels that are receivable in the region where the television receiver is located so that, thereafter, such channels can be received or selected merely by actuation of the switches $S_1$–$S_{16}$ corresponding to the respective addresses, mode change-over switch 61 is engaged with contact a for selecting the programming mode of operation and for providing a binary "1" signal $P_A$. If it is desired, for example, to store at the address of memory unit $51_1$ a channel identifying code corresponding to the frequency of channel "2", address selecting switch $S_1$ is manually closed. The binary "1" at line $L_1$ of decoder 72 is applied through switch $S_1$ to turn ON transistor 77 in address selecting circuit 70. Thus, inverter 78 supplies a binary "1" to NAND circuit 79 which is conditioned to apply a binary "0" to address counter 71 in response to each timing pulse $A_9$ from timing counter 20. Address counter 71 counts each binary "0" applied thereto until the resulting 4-bit code from address counter 71 corresponds to the address of memory unit $51_1$ selected by the closing of switch $S_1$. At that time, decoder 72 decodes this particular 4-bit code from address counter 71 to provide a binary "0" on the corresponding output line $L_1$. This binary "0" on line $L_1$ turns OFF transistor 77 so that inverter 78 disables NAND circuit 79 with a binary "0" and address counter 71 ceases counting. Accordingly, the 4-bit address code corresponding to switch $S_1$ is applied to memory 50 for selecting or activating the address of memory unit $51_1$ corresponding to switch $S_1$.

Since channel "2" is a low VHF channel, switch $S_L$ of band indicating signal forming circuit 80 is closed to provide a binary "1" to NAND circuit $83_L$ through inverter $82_L$. It is recalled that $P_A$ is a binary "1" and, therefore, NAND circuit $82_L$ applied a binary "0" to band memory 84, whereby the band indicating signal $P_L$ is supplied through encoder 52 and decoder 53 of memory 50 (FIG. 2) to provide the signal $V_L$ for selecting the low band or channel of the VHF tuning section in tuner 100.

Having selected the memory address at which a channel identifying code is to be programmed and the band or section of tuner 100 which is associated with the channel to be programmed, sweep pulse generating circuit 30 is made operative, for example, by closing coarse up-sweep switch 31CU. When switch 31CU is closed, inverted $33_3$ applies a binary "1" to NAND circuit $34_3$. Therefore, at each "0" level of timing pulse $A_{14}$ (which pulse has a period of 4.096 m.sec.), NAND circuit $34_3$ applies a binary "1" to one input of NAND circuit 304. Since the fine up-sweep switch 31FU is open, inverter $33_1$ applies a binary "0" to NAND circuit $34_1$ which, in turn, supplies a constant binary "1" to another input of NAND circuit 304. Also, the closing of switch 31CU applies a binary "0" to NAND circuit 36, resulting in a binary "0" applied to NAND circuit $38_1$. Hence, this latter NAND circuit supplies a constant binary "1" to yet another input of NAND circuit 304. Therefore, when coarse up-sweep switch 31CU is closed, NAND circuit 304 applies a binary "0" to inverter 308 in response to each timing pulse $A_{14}$, whereupon an up-sweep pulse $P_U$ is applied to counter 401. These pulse $P_U$ now exhibit a short period of 4.096 m.sec. and, therefore, may be considered coarse up-sweep pulses which cause relatively rapid changes in the count of counter 40. The count of counter 40 thus is changed, in sequence, in the upward direction to similarly change the resulting channel identifying code $B_1, B_2 \ldots B_{14}$ obtained therefrom once during every period T of the timing code $A_1, A_2 \ldots B_{14}$, starting from the state (00000000000000) and incrementing toward a maximum state (11111111111111). The changing channel identifying code from counter 40 and the recirculating timing code from timing counter 20 are applied to pulse-width modulator 91 to obtain an analog level corresponding to the channel identifying code, in the programming mode of operation. Thus, so long as switch 31CU of sweep pulse generating circuit 30 is held in its closed condition, the channel selecting or control voltage from low pass filter 92 is increased progressively, for example, by about 2 m.V at every period T=4.096 m.sec. of the recirculating timing code, and hence the receiving frequency established by tuner 100 increase progressively.

When a video picture being broadcast by channel "2" appears on the screen of the televison receiver, the coarse up-sweep switch 31CU is released by the operator so as to return to its normal open condition. Upon opening of switch 31CU, the supplying of the coarse up-sweep pulses $P_U$ to counter 40 is terminated and the count then exhibited by counter 40 remains unchanged. This count represents that channel identifying code $B_1$, $B_2 \ldots B_{14}$ to determine the approximate value of the receiving frequency of tuner 100 for the desired channel. Thereafter, the fine up-sweep switch 31FU may be closed to provide fine up-sweep pulses $P_U$ from inverter 37, which fine up-sweep pulses have a period 64 times that of the coarse up-sweep pulses by reason of divider 35. That is, when switch 31FU is closed, NAND circuit $34_1$ is conditioned to supply the fine pulses $(A_{14} \div 64)$ through conditioned NAND circuit 304 and inverter 308. In counting the fine up-sweep pulses, counter 40 sequentially changes its count, and thus the resulting channel identifying code $B_1, B_2 \ldots B_{14}$, at every period 64T=262.144 m.sec. Thus, the channel selecting or control voltage from low pass filter 92 is increased by about 2 mV at every period 64T for similarly changing the receiving frequency determined by tuner 100.

When viewing of the picture on the screen of the television receiver indicates that fine turning has been achieved in respect to the video signal broadcast by the desired channel, switch 31FU is released to return to its open condition and thereby halt the supplying of the fine up-sweep pulses to counter 40. Accordingly, counter 40 stops counting with the instantaneous count thereof representing the resulting channel identifying code $B_1, B_2 \ldots B_{14}$ corrresponding to a value of the analog control voltage applied to tuner 100 to establish a receiving frequency for the fine-tuned reception of channel "2". Thereafter, write-in switch 62 is closed to supply a binary "1" to NAND circuit 63 which had been enabled, or conditioned, by the binary "1" of signal $P_A$. The binary "0" thus produced by NAND circuit 63 energizes instruction signal forming circuit 65 to supply an erasing pulse $P_E$ to memory 50 so as to erase any contents previously stored in the addressed memory unit $51_1$ (selected by the closing of switch $S_1$) and then to supply a write-in pulse $P_{WR}$ to memory unit $51_1$ to enable the channel identifying code $B_1, B_2 \ldots B_{14}$ of counter 40 and the band identifying signal $P_L$ from band memory 84 to be written into the respective cells of memory unit $51_1$.

When all of switches 31FU, 31FD, 31CU and 31CD are opened, NAND circuit 36 produces a binary "0+ which is inverted by inverter 37 and applied as a binary "1" to condition NAND circuits $38_1$ and $38_2$ to respond to AFT control pulses $X_U$ and $X_D$ produced by AFT control circuit 140 in the event that the discriminated outputs $E_U$ or $E_D$, respectively, are produced by AFT circuit 120 during an AFT operation, as will be described. That is, if AFT circuit 120 detects that the control voltage then being applied to tuner 100 establishes a frequency that deviates from the broadcast channel "2" frequency, the AFT operation will apply either up-sweep pulses $P_U$ or down-sweep pulses $P_D$ to counter 40 so as to adjust the channel identifying code $B_1, B_2 \ldots B_{14}$ until the apparatus is fine-tuned to broadcast channel "2". Preferably, this adjusted channel identifying code is written into the respective cells of memory unit $51_1$.

Following the programming of memory unit $51_1$ with a channel identifying code and a band indicating code corresponding to channel "2", the other memory units $51_2$–$51_{16}$ of memory 50 may be similarly programmed with coded information corresponding to other VHF and/or UHF channels that are receivable in the region where the television receiver is located. Thus, for example, if it is desired to program memory unit $51_2$ with coded information corresponding to channel "4", change-over switch 61 is kept in engagement with its fixed contact $a$ for establishing the programming mode of operation, and address selecting switch $S_2$ is closed for addressing memory unit $51_2$. Since channel "4" is also a low VHF channel, switch $S_L$ of band indicating signal forming circuit 80 again is closed and, for example, coarse up-sweep switch 31CU of the sweep-pulse generating circuit is held in its closed position until counter 40, in counting the resulting up-sweep pulses, has changed the channel identifying code $B_1, B_2 \ldots B_{14}$ from the code that represented fine tuning of channel "2" to the code representing approximate tuning of channel "4". After the channel identifying code has been further modified by fine tuning (and AFT), as described above, write-in switch 62 is again closed for effecting the writing into memory $51_2$ of the channel identifying and band indicating codes for the desired channel "4". Thus, at each of the addresses of memory 50 there can be sequentially written or stored the channel identifying and band indicating codes corresponding to a respective desired channel.

Although the programming of the channel selecting apparatus according to this invention has been described above as being effected by the sequential closing of the coarse up-sweep switch 31CU and the fine up-sweep switch 31FU, in which case, the coarse or fine up-sweep pulses $P_U$ are counted in the upward direction by counter 40 for progressively increasing the receiving frequency of tuner 100, it will be apparent that the programming operation can be similarly effected by the closing of the coarse down-sweep switch 31CD and the fine down-sweep switch 31FD so that counter 40 is made to count in the downward direction for progressively decreasing the receiving frequency of tuner 100, or by the closing of coarse up-sweep switch 31CU and then fine down-sweep switch 31FD, etc. Whether counter 40 is made to count in the upward direction or in the downward direction, as aforesaid, is merely dependent upon the relationship of the receiving frequency for a channel which is to be programmed relative to the receiving frequency for the channel which has been previously programmed and, in each case, the direction in which counter 40 is made to count is selected so as to minimize the time required for the programming operation.

Channel Selecting Mode of Operation

After the programming of memory 50 has been completed, as described above, mode change-over switch 61 can be closed to its fixed contact $b$ and thereby provide the signal $P_A$ as a binary "0" for establishing the channel selecting mode of operation. This binary "0" signal $P_A$ disables NAND circuits $83_L$, $83_H$ and $83_U$, and also NAND circuit 63, thus de-energizing band indicating signal forming circuit 84 and instruction signal forming circuit 65 so that the latter supplies the reading pulse $P_R$ to memory 50.

Preferably, when the channel selecting apparatus is initially turned ON, address counter 71 of address selecting circuit 70 is reset thereby to produce a 4-bit code addressing memory unit $51_1$ in memory 50. Also, circuit 47 detects the initial energization of the power supply to trigger monostable multivibrator 45 so that NAND circuit 44 supplies a binary "0" pulse to inverter 48, thereby producing a load pulse $P_B$. Load pulse $P_B$, when applied to AND circuits $42_1$–$42_{14}$ in counter 40 (FIG. 2), transmits the channel identifying code $C_1$, $C_2$ ... $C_{14}$ previously stored in memory unit $51_1$ to counter 40. At the same time, the band indicating code stored in the respective cells of memory unit $51_1$ is read out to decoder 53 so that, for example, the signal $V_L$ is applied to tuner 100 for selecting the low band of the VHF tuning section. During the duration of load pulse $P_B$, the bits $C_1$–$C_{14}$ of the read out channel identifying code are applied to the respective flip-flop circuits $41_1$–$41_{14}$ of counter 40 with the result that such flip-flop circuits are set for providing the channel identifying code $B_1$–$B_{14}$ from counter 40 to pulse-width modulator 91, whereby a control voltage for tuner 100 suitable for fine tuning of the receiving frequency to that of channel "2" (assumed to be stored in memory unit $51_1$) is produced. The load pulse also controls the operation of AFT control circuit 140, as will be explained below.

Thereafter, if it is desired to receive a channel programmed in any other memory unit of memory 50, for example, if it is desired to receive channel "4" programmed in memory unit $51_2$, as described above, switch $S_2$ of address selecting circuit 70 is closed and, as previously described in connection with the programming mode of operation, address counter 71 counts the pulses $A_9$ until 4-bit code from address counter 71 reaches the count corresponding to the address of the second memory unit $51_2$. When this count is reached, decoder 72 applies a binary "0" to output line $L_2$ so that transistor 77 is turned OFF and its collector output rises from a binary "0" level to a binary "1" level. Such rise in the collector output of transistor 77 triggers monostable multivibrator 45, the output from which is applied as a binary "1" to NAND circuit 44. Since the signal $P_A$ is a binary "0", inverter 43 conditions NAND circuit 44 to respond to the monostable multivibrator output and apply a binary "0" to inverter circuit 48, resulting in a load pulse $P_B$ applied to counter 40 and to AFT control circuit 140. In response to the load pulse $P_B$, the channel identifying code being read out of memory unit $51_2$ correspondingly changes the states of the flip-flop circuits of counter 40 so that the latter supplies the corresponding channel identifying code $B_1$, $B_2$ ... $B_{14}$ to pulse width modulator 91. Therefore, the control voltage applied to tuner 100 is sufficient to cause the tuner to establish the receiving frequency for channel "4".

It will be apparent that the channels programmed in the other memory units $51_3$–$51_{16}$ may be similarly selectively received merely by closing a respective one of the address selecting switches $S_1$–$S_{16}$.

AFT Operation

In the illustrated channel selecting apparatus, the AFT operation is performed substantially continuously during the channel selecting mode, that is, when a switch $S_1$ ... $S_{16}$ is actuated to change the channel to which tuner 100 is tuned, and when the powder supply first is energized to automatically select a pre-set channel. As discussed above, when a particular switch $S_1$ ... $S_{16}$ is actuated, address counter 71 selects a different memory unit 51 in memory 50 from which the stored channel identifying code is read out; and this changes the control voltage applied to tuner 100. It may be expected that the control voltage changes gradually and, while changing, its instantaneous level may correspond to an unwanted frequency, such as the frequency assigned to a non-selected (i.e., non-programmed) channel or the audio carrier frequency of an adjacent, lower channel. AFT circuit 120 will attempt to pull in this unwanted frequency; and if the control voltage change is sufficiently slow, the AFT operation may successfully tune the apparatus to such an unwanted frequency.

Similarly, when the powder source is turned ON and address counter 71 addresses a predetermined memory unit ($51_1$) to supply a corresponding channel identifying code to converter 90, the AFT operation may pull in an unwanted frequency corresponding to an instantaneous level of the control voltage applied to tuner 100 prior to the time that the gradually increasing control voltage reaches the level determined by the read-out channel identifying code.

Figure 5:
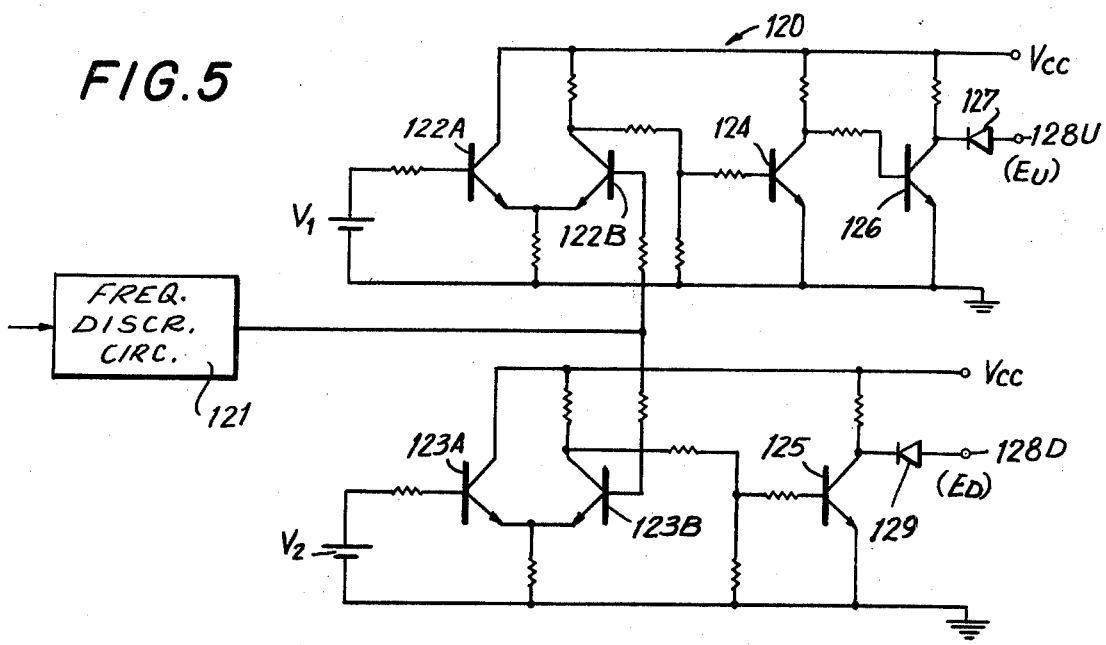
FIG. 5 is a schematic diagram illustrating a portion of the AFT circuit that is used with the electronic tuner of FIG. 1.
Figure 6A:
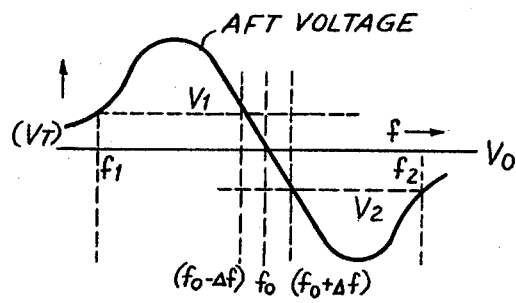
FIGS. 6A–6C are waveform diagrams that are helpful in explaining the AFT operation performed by the circuit shown in FIG. 5.

The foregoing may best be appreciated by first considering the AFT circuit and its operation. As seen in FIG. 5 AFT circuit 120 comprises a conventional frequency discriminator circuit 121 connected to the output of video IF amplifier 110 to provide an AFT voltage $V_T$. As shown in FIG. 6A, the AFT voltage $V_T$ has a predetermined value $V_o$ when the video intermediate frequency $f$ has the correct value $f_o$, and the AFT voltage $V_T$ varies from the value $V_o$ in accordance with a generally S-shaped curve for values of the video intermediate frequency above and below the value $f_o$. The output of frequency discriminator circuit 121 is coupled to a first differential amplifier comprised of transistors 122A and 122B and to a second differential amplifier comprised of transistors 123A and 123B. Reference voltages $V_1$ and $V_2$ ($V_1 > V_o > V_2$) are respectively applied to the base electrodes of transistors 122A and 123A, while the AFT voltage $V_T$ from circuit 121 is applied to the base electrodes of transistors 122B and 123B. The collector outputs of transistors 122B and 123B are applied to the base electrodes of transistors 124 and 125, respectively, and the collector output of transistor 124 is applied, in turn, to the base electrode of a transistor 126. Finally, the collector output of transistor 126 is coupled through a diode 127 to an output terminal 128U to provide the discriminated output $E_U$, and the collector output of transistor 125 is coupled through a diode 129 to an output terminal 128D to provide the discriminated output $E_D$.

Figure 6B:
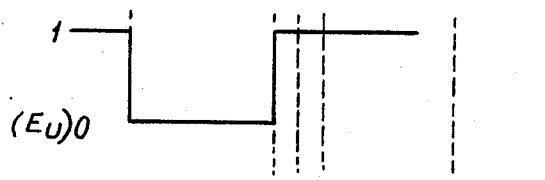
Figure 6C:
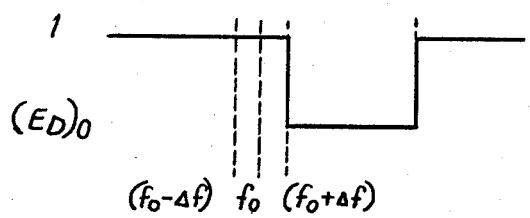

When the AFT voltage $V_T$ exceeds the reference voltage $V_1$, that is, when the video intermediate frequency from amplifier 110 is within the AFT pull-in range so as to be greater than $f_1$ but less than $(f_o - \Delta f)$, transistors 122A and 122B are respectively non-conductive and conductive. Therefore, transistor 124 is tuned OFF so as to turn ON transistor 126 and a low voltage corresponding to a binary "0" is provided at the collector electrode of the latter and coupled through diode 127 to output terminal 128U as the discriminated output $E_U$, as shown in FIG. 6B. At the same time, transistor 123B is turned ON thereby to make transistor 125 non-conductive, so that the collector voltage of the latter transistor is at a high level corresponding to a binary "1" which is coupled through diode 129 to output terminal 128D as the discriminated output $E_D$, as shown in FIG. 6C.

If the video intermediate frequency from amplifier 110 is between the frequencies $(f_o-\Delta f)$ and $(f_o+\Delta f)$, that is, within the normal tuning range, the AFT voltage from circuit 121 is between $V_1$ and $V_2$ and, therefore, transistor 123B remains ON and the discriminated output $E_D$ continues to be a binary "1". However, with $V_T$ being less than $V_1$, transistor 122B is turned OFF and, as a result, transistor 126 is made non-conductive so that the discriminated output $E_U$ becomes a binary "1".

Finally, when the AFT voltage $V_T$ from frequency discriminating circuit 121 is less than $V_2$, that is, when the video intermediate frequency from amplifier 110 is within the AFT pull-in range so as to be less than $f_2$ but greater than $(f_o+\Delta f)$, the discriminated output $E_U$ remains as a binary "1", but transistor 123B is turned OFF so as to make transistor 125 conductive and, as a result thereof, the discriminated output $E_D$ becomes a binary "0".

The reference voltages $V_1$ and $V_2$ of AFT circuit 120 are suitably selected so that $\Delta f$ will be about 50 kHz. In the normal tuned condition, that is, when the frequency $f$ is between $f_o-50$ kHz and $f_o+50$ kHz, the discriminated outputs $E_U$ and $E_D$ are both a binary "1" and no correction is made in the channel identifying code $B_1$, $B_2 \ldots B_{14}$ applied to pulse width modulator 91. Hence, the control voltage applied to tuner 100, which determines the local oscillation frequency established in the turner 100, and thus the channel frequency to which the apparatus is tuned, is not varied. On the other hand, when $f$ is less than $f_o-50$ kHz but within the pull-in range, the resulting binary "0" of discriminated output $E_U$ is effective to condition control circuit 140 to supply upward correction pulses $X_U$ (FIG. 1) which are counted by counter 40 for modifying the channel identifying code $B_1$, $B_2 \ldots B_{14}$ so as to raise the local oscillation frequency and thereby bring the receiver to the normal or correct tuned condition. Conversely, if the frequency $f$ is greater than $f_o+50$ kHz but within the pull-in range, the resulting binary "0" of the discriminated output $E_D$ is effective to condition control circuit 140 to supply downward correction pulses $X_D$ which are counted downwardly by counter 40 so that the channel identifying code $B_1$, $B_2 \ldots B_{14}$ applied from counter 40 to pulse width modulator 91 is modified for decreasing the local oscillation frequency and thereby provide the normal or correct tuned condition of the receiver.

In view of the foregoing, it is appreciated that the AFT operation may successfully pull in an unwanted frequency, such as a frequency corresponding to a lower channel or a frequency corresponding to the audio carrier associated with a lower channel, during the time required for the control voltage applied to tuner 100 to rise gradually to its predetermined level (as may be attributed to the time constant of low-pass filter 92) following the read-out of the channel identifying code stored in a predetermined memory unit. This erroneous pull-in is avoided in accordance with the present invention wherein a control circuit 140 is provided.

As shown in FIG. 1, control circuit 140 is comprised of a monostable multivibrator, or one-shot circuit, 141, which is responsive to a load pulse $P_B$ applied thereto for establishing a predetermined time duration, a gating circuit formed of NAND circuits 147, 148 and 149 for selectively supplying correction pulses of a relatively high frequency, such as the aforementioned relatively coarse timing pulses $A_{14}$ or of a relatively low frequency such as the fine timing pulses $A_{20}$. Correction circuit 140 additionally includes a pair of NAND circuits 150 and 151 for selectively transmitting the correction pulses either as upward correction pulses $X_U$ or downward correction pulses $X_D$ depending upon the discriminated output $E_U$ or $E_D$ produced by AFT circuit 120. As described above, these correction pulses are applied to NAND circuits $38_1$ and $38_2$, respectively, to modify the count of counter 40, thus modifying the channel identifying code $B_1$, $B_2 \ldots B_{14}$.

The gating circuit formed of NAND circuits 147, 148 and 149 is controlled by a flip-flop circuit 145 which, as will be described, normally is in its reset state but is switched to its set state at a predetermined time following the production of load pulse $P_B$. Essentially, correcting circuit 140 functions to produce correction pulses $X_U$ or $X_D$ at a relatively slow rate when a channel identifying code first is read out of memory 50 by a load pulse $P_B$, that is, when the converted control voltage produced by converter 90 increases so that the tuning condition of the illustrated apparatus approaches the frequency corresponding to that of the read out channel identifying code, and then correction pulses $X_U$ or $X_D$ are produced at a relatively higher rate when the frequency to which the tuner is tuned deviates from the desired frequency, that is, the frequency corresponding to the read out channel identifying code, within the AFT pull-in range.

The output of monostable multivibrator 141 is inverted by an inverter 142, differentiated by a differentiator circuit 143 and then supplied to the set input of flip-flop circuit 145 by a transistor 144. The reset input of flip-flop circuit 145 is coupled to a NAND circuit 146 whose inputs are supplied with the discriminated outputs $E_U$ and $E_D$, respectively, produced by AFT circuit 120. These discriminated outputs also are inverted by inverters 152 and 153, respectively, to be applied to NAND circuits 150 and 151. The aforementioned coarse timing pulses $A_{14}$ are applied to a NAND circuit 147 which is conditioned when flip-flop circuit 145 is in its set state. Similarly, the fine timing pulses $A_{20}$ are applied to a NAND circuit 148 which is conditioned when the flip-flop circuit is in its reset state. The outputs of NAND circuits 147 and 148 are coupled through NAND circuit 149 to the respective inputs of NAND circuits 150 and 151.

The operation of correcting circuit 140 will best be understood in conjunction with the waveform diagrams illustrated in FIGS. 7A–7L. Let it be assumed that the channel identifying code stored at a selected address in memory 50 is read out therefrom by load pulse $P_B$. It had been assumed previously that this load pulse is a positive pulse, as shown in FIG. 7A, and thus triggers monostable multivibrator 141, as shown in FIG. 7H. Preferably, the time constant of the monostable multivibrator is, for example, 50 m.sec., so that the monostable multivibrator is triggered from its quiescent state to its active state and then, after this 50 m.sec. duration, returns to its quiescent state. The output $S_M$ of multivibrator 141 is inverted to $\overline{S}_M$ by inverter 142, as shown in FIG. 7I, and this inverted signal is differentiated by differentiating circuit 143 to form negative-going and positive-going pulses $P_p$ at the transitions of signal $\overline{S}_M$, as shown in FIG. 7J. Differentiated pulses $P_P$ are applied to transistor 144 and, as shown in FIG. 7K, the positive-going pulse $P_P$ is effective to turn the transistor ON such that this pulse is inverted and supplied to the set input of flip-flop circuit 145 as negative-going pulse $P_M$.

The channel identifying code read out of memory 50 into counter 40 is converted by analog-to-digital converter 90 to a corresponding analog signal, as shown in FIG. 7B, which gradually rises from an initial level, which may be zero, at time $t_o$ toward its predetermined level $l_2$. As is apparent, a finite time delay is required for this control voltage to reach its predetermined level. Moreover, and in view of the time constant of low-pass filter 92, the control voltage rises at a relatively rapid rate during an initial portion of this time delay, followed by a more gradual, essentially asymptotic increase. Let it be assumed that, in order to reach its predetermined level $l_2$, the control voltage must pass through an intermediate level $l_1$ which corresponds to an undesired frequency, such as the frequency assigned to a non-selected channel or the audio carrier frequency of an adjacent, lower channel, as mentioned above. Let it further be assumed that the frequency corresponding to level $m_1$ is approximately at the beginning of the AFT pull-in range. Hence, as shown in FIGS. 6B and 6C, discriminated outputs $E_U$ and $E_D$ of AFT circuit 120 both correspond to a binary "1" when the channel selecting apparatus is tuned (by the increasing control voltage) to a frequency that is outside the pull-in range. However, when level $m_1$ is reached at the beginning of the pull-in range, discriminated output $E_U$ changes to a binary "0" as shown in FIG. 7C. Of course, at this time, discriminated output $E_D$ remains at its binary "1" level.

Let it be assumed that, prior to this time, flip-flop circuit 145 had been reset. This will be explained in greater detail below. When discriminated outputs $E_U$ and $E_D$ both were at the binary "1" level, NAND circuit 146 applied a binary "0" to the reset input of the flip-flop circuit. Now, when discriminated output $E_U$ changes to a binary "0", NAND circuit 146 applies a binary "1" to the reset input. However, flip-flop circuit 145 preferably is of the so-called negative-edge triggered type and, therefore, does not respond to the positive transition applied to its reset input by the NAND circuit 146. Nevertheless, since the flip-flop circuit is assumed to be in its reset state, a binary "1" is applied by its $\overline{Q}$ output to NAND circuit 148, thus conditioning this NAND circuit to transmit the fine timing pulses $A_{20}$ to NAND circuit 149. It is recalled that these fine timing pulses have a period of approximately 256 m.sec. Thus, for the time period in question, that is, the period that monostable multivibrator 141 remains in its active state (50 m.sec.), it will be expected that, at most, only a single fine timing pulse will be transmitted by NAND circuit 148 through NAND circuit 149, as indicated in FIG. 7F.

Since discriminated output $E_U$ is a binary "0" (FIG. 7C), inverter 152 applies a binary "1" to condition NAND circuit 150 to transmit the fine timing pulse $A_{20}$ applied thereto by NAND circuit 149. Thus, when the control voltage rises to the level $m_1$, AFT correcting circuit 140 applies a single correcting pulse (FIG. 7F) $X_U$ to NAND circuit $38_1$. It is recognized that this correcting pulse produces an up-sweep pulse $P_U$ to increment the count of counter 40 by a single bit.

It is apparent that the control voltage is increasing at a rate that is much greater than the fine timing pulse correction rate as determined by correction pulse $X_U$. Thus, this AFT operation performed at such a slow rate is not capable of locking the channel selecting apparatus to an unwanted frequency corresponding to, for example, the instantaneous level $l_1$ that is traversed by the control voltage gradually increases toward its predetermined level $l_2$.

As shown in FIGS. 7C and 7D, when the local oscillation frequency established in tuner 100 by the gradually increasing control voltage is less than the frequency associated with level $l_1$ by 50 kHz, discriminated output $E_U$ changes to a binary "1". When the local oscillation frequency increases in response to the increasing control voltage so as to be greater than the frequency associated with level $l_1$ by 50 kHz, discriminated output $E_D$ changes to a binary "0". Thus, for the interval that the local oscillation frequency is within the 100 kHz tuning range, both discriminated outputs $E_U$ and $E_D$ are a binary "1", resulting in a binary "0" produced by NAND circuit 146. This negative transition in the NAND circuit resets flip-flop circuit 145. Of course, since the flip-flop circuit had been assumed to be in its reset state, this negative transition applied to its reset input at this time has no effect thereon.

Discriminated output $E_U$ remains as a binary "1" and discriminated output $E_D$ is a binary "0" until the local oscillation frequency as determined by the control voltage increases beyond the AFT pull-in range. Thus, when the control voltage increases to the level $n_1$ (FIG. 7B), discriminated output $E_D$ returns to a binary "1" level. This change in the discriminated output $E_D$ activates NAND circuit 146 to apply a binary "0" to flip-flop circuit 145. As before, this negative transition applied to the reset input of the flip-flop circuit has no effect thereon because the flip-flop circuit had been assumed to be in its reset state.

As the control voltage shown in FIG. 7B continues to rise toward its predetermined level $l_2$, it reaches the level $m_2$ which is associated with a frequency just within the AFT pullin range. Hence, discriminated output $E_U$ changes to a binary "0", as shown in FIG. 7C. As mentioned before, this conditions NAND circuit 150 to transmit correction pulses which may be applied thereto by NAND circuit 149. However, since flip-flop circuit 145 remains in its reset state, only fine timing pulses $A_{20}$ are transmitted, and no further fine timing pulse will be produced during the 50 m.sec. time period established by monostable multivibrator 141.

In general, the 50 m.sec. time period established by monostable multivibrator 141 will be less than the time required for the correcting voltage to increase to its predetermined level $l_2$. Hence, at the conclusion of this time period, negative-going pulse $P_M$ sets flip-flop circuit 145 so that a binary "1" is applied by its Q output to condition NAND circuit 147. Consequently, coarse timing pulses $A_{14}$ are transmitted through NAND circuits 147 and 149 to NAND circuits 150 and 151, respectively. At this time, discriminated output $E_U$ remains as a binary "0" because the correcting voltage has not yet reached its predetermined level $l_2$ and, therefore, the local oscillation frequency in tuner 100 is less than the desired frequency. The coarse timing pulses $A_{14}$ are transmitted by NAND circuit 150 as correction pulses $X_U$ as long as this NAND circuit is conditioned by discriminated output $E_U$ and as long as flip-flop circuit 145 remains in its set state.

Thus, fine timing pulses $A_{14}$ are used to carry out the AFT operation at a relatively high rate. This means that the control voltage now is rapidly increased from its level $m_3$ attained at time $t_1$ when flip-flop circuit 145 is set to its predetermined level $l_2$. As may be seen from FIG. 7B, in the absence of this higher speed AFT operation, the control voltage would have increased from level $m_3$ to its predetermined level $l_2$ at an undesirably slow rate. Proper tuning of the illustrated apparatus to the selected channel frequency would be inordinately delayed in the absence of the higher repetition rate correction pulses $X_U$.

When the control voltage tunes tuner 100 to a frequency within 50 kHz of the selected frequency, discriminated output $E_U$ changes to a binary "1", as shown in FIG. 7C at time $t_2$. Since discriminated outputs $E_U$ and $E_D$ each are a binary "1", NAND circuit 146 applies a binary "0" to the reset input of flip-flop circuit 145, as shown in FIG. 7E. The negative transition applied to this reset input resets the flip-flop circuit as shown in FIG. 7L. Hence, signal $S_F$ applied to NAND circuit 147 by the Q output of flip-flop circuit 145 changes from a binary "1" to a binary "0", thereby inhibiting, or disabling, this NAND circuit. Simultaneously, the signal $\bar{S}_F$ applied by the $\bar{Q}$ output of flip-flop circuit 145 to NAND circuit 148 is changed from a binary "0" to a binary "1", thereby conditioning this NAND circuit to transmit the fine timing pulses $A_{20}$ through NAND circuit 149 to NAND circuits 150 and 151, respectively. However, since both discriminated outputs $E_U$ and $E_D$ are a binary "1", inverters 152 and 153 inhibit NAND circuits 150 and 151, respectively, such that the timing pulses $A_{20}$ are not transmitted as correction pulses $X_U$ or $X_D$.

Although tuner 100 included in the illustrated channel selecting apparatus now is tuned to the frequency associated with level $l_2$ of the control voltage, the local oscillation frequency in tuner 100 may drift thereby to vary the channel frequency to which the apparatus is tuned. For example, if the local oscillation frequency increases so as to exceed the proper frequency by 50 kHz, discriminated output $E_D$ will change to a binary "0", as shown in FIG. 7D. Hence, inverter 153 produces a binary "1" to condition NAND circuit 151 to transmit correction pulses $X_D$. Since flip-flop circuit 145 had been reset (FIG. 7L) and a load pulse $P_B$ had not been produced subsequently, the reset state of this flip-flop circuit conditions NAND circuit 148 to transmit the fine timing pulses $A_{20}$ through NAND circuit 149 to conditioned circuit 151. These correction pulses $X_D$, as shown in FIG. 7G, are of a low repetition rate but are sufficient to decrement the count stored in counter 40 so as to correspondingly decrease the control voltage applied to tuner 100, whereby the tuner returns to its properly tuned condition. Of course, when this tuning condition is restored, discriminated output $E_D$ returns to its binary "1" level and NAND circuit 146 applies a reset signal to flip-flop circuit 145. Since the flip-flop circuit had been in its reset state, this reset signal has no effect thereon.

As may be appreciated, a similar low frequency AFT operation will be performed in the event that the local oscillation frequency drifts to a value that is less than the correct tuning frequency by more than 50 kHz. In that event, discriminated output $E_U$ changes from a binary "1" to a binary "0" and NAND circuit 150 is conditioned to transmit the fine timing pulses $A_{20}$ as lower frequency correction pulses $X_U$.

Thus, in accordance with the present invention, when a control voltage first is applied to tuner 100 and gradually changes (i.e., increases or decreases from an initial level toward its predetermined level), an AFT operation is carried out at a relatively low rate so as to avoid pulling in an unwanted frequency as the tuning condition of the tuner approaches the desired frequency. When the frequency to which the tuner is tuned differs from the desired frequency by an amount that falls within the pull-in range, the AFT operation then is carried out at a relatively faster rate so as to rapidly tune the tuner to the desired frequency. Hence, the tuner will not be erroneously tuned to an unwanted frequency during the interval that the control voltage rapidly increases toward its predetermined level.

While the present invention has been particularly shown and described with reference to a preferred embodiment thereof and in conjunction with a particular channel selecting apparatus, various changes and modifications in form and details may be made by one of ordinary skill in the art without departing from the spirit and scope of the invention. For example, the time interval established by monostable multivibrator 141 preferably encompasses the duration during which the control voltage changes at a relatively rapid rate. In the waveforms shown in FIG. 7, it has been assumed that this duration is approximately 50 m.sec. It is appreciated that the time interval established by the monostable multivibrator can be reduced if the initial portion of the control voltage changes at a faster rate so as to attain level $m_3$ in less than 50 m.sec.; and, conversely, this time interval can be increased in the event that the initial portion of the control voltage changes at a slower rate so as to attain level $m_3$ in more than 50 m.sec. It is intended that the appended claims be interpreted as including this and other such changes and modifications.

What is claimed is:

1. A method of tuning an AFT-controlled channel selecting apparatus to a selected channel-frequency wherein said apparatus comprises a storage device for storing digital representations corresponding to predetermined channel-frequencies, comprising the steps of reading out a selected digital representation from said storage device; converting said read out representation to a corresponding control signal, said control signal gradually increasing to its control level; applying said control signal to a controllable tuning element included in an electronic tuner so as to tune said tuner to a frequency corresponding to the level of said control signal; detecting the deviation between the frequency to which said tuner is tuned and a predetermined frequency; varying said read out representation at a first rate when the tuning of said tuner approaches said predetermined frequency; and varying said read out representation at a second rate when said tuner is tuned to a frequency that deviates from said predetermined frequency within a predetermined range.

2. The method of claim 1 wherein said steps of varying said read out representation at first and second rates comprises establishing a predetermined time interval commencing with the reading out of said selected digital representation; varying said read out representation at a relatively low rate during said time interval when said tuner is tuned to a frequency that deviates from a predetermined frequency by an amount within said predetermined range; and varying said read out representation at a relatively high rate following said time interval when said tuner is tuned to a frequency that deviates from a predetermined frequency by an amount within said predetermined range.

3. The method of claim 2 wherein said relatively low rate of varying said read out representation is less than the rate at which said converted read out representation gradually increases.

4. The method of claim 2 wherein said steps of varying said read out representation at said relatively low and high rates comprises generating periodic pulses of a relatively low repetitive rate; generating periodic pulses of a relatively high repetitive rate; changing said read out representation with said low rate periodic pulses during said time interval when said tuner is tuned to a frequency that deviates from a predetermined frequency by an amount within said predetermined range; and changing said read out representation with said high rate periodic pulses following said time interval when said tuner is tuned to a frequency that deviates from a predetermined frequency by an amount within said predetermined range.

5. The method of claim 4 wherein said step of reading out a selected digital representation comprises applying a storage location address to said storage device; and applying a read-out pulse to said storage device to read out the contents of said addressed storage location; and wherein said time interval is established by generating a pulse of predetermined duration in response to said read-out pulses, said low rate periodic pulses normally being transmitted during said pulse duration and said high rate periodic pulses normally being transmitted following said pulse duration when said tuner is tuned to a frequency that deviates from a predetermined frequency by an amount within said predetermined range.

6. Frequency selecting apparatus comprised of programmable storage means for storing at addressable locations digital representations of respective plural broadcast frequencies to which a tuner included in said apparatus is adapted to be tuned; read-out means for selectively reading out a digital representation from said storage means; converting means for converting said read out representation into a corresponding control voltage that gradually increases toward a predetermined level; a tuning element for receiving said control voltage to tune said tuner to said respective broadcast frequency; automatic fine tuning means for varying said selected representation read out from said storage means; and control means for controlling said automatic fine tuning means to vary said read out representation at a relatively low rate for a time interval that said control voltage approaches said predetermined level and at a relatively high rate following said time interval when said control voltage tunes said tuning element to within a predetermined range of said respective broadcast frequency.

7. The apparatus of claim 6 wherein said control voltage increases at a faster rate during said time interval than the relatively low rate at which said automatic fine tuning means varies said read out representation; and wherein said automatic fine tuning means comprises means for detecting the deviation between the frequency to which said tuner is tuned by said control voltage and a predetermined frequency to produce a first control signal when the tuned frequency is less than said predetermined frequency by an amount within a predetermined range and to produce a second control signal when the tuned frequency is greater than said predetermined frequency by an amount within said predetermined range.

8. The apparatus of claim 7 wherein said control means comprises pulse supply means for supplying first pulses at a relatively low repetition rate and for supplying second pulses at a relatively high repetition rate; and means for varying said read out representation with said first pulses in a first direction in response to said first control signal and in a second direction in response to said second control signal for said time interval that said control voltage approaches said predetermined level, and for varying said read out representation with said second pulses in said first direction in response to said first control signal and in said second direction in response to said second control signal following said time interval.

9. The apparatus of claim 8 wherein said read-out means comprises address generating means for generating an address of a predetermined location in said storage means and read-out pulse generating means for applying a read-out pulse to said storage means for causing the digital representation stored at the addressed predetermined location to be read out therefrom; and wherein said control means further comprises monostable multivibrator means normally exhibiting a quiescent state and being triggered to an active state for a predetermined time period when said read-out pulse is generated, and gate means for gating said first pulses with said first or second control signal when said monostable multivibrator means exhibits its active state and for gating said second pulses with said first or second control signal when said monostable multivibrator means returns to its quiescent state.

10. The apparatus of claim 9 further comprising an incrementable up/down counter for storing said read out digital representation, and wherein said gate means comprises bistate means, means responsive to said first and second control signals for setting said bistate means to a first state when said tuner is substantially tuned to a predetermined frequency, means for setting said bistate means to a second state when said monostable multivibrator means returns to its quiescent state, a first gate circuit for producing change pulses constituted by said first pulses when said bistate means is set to said first state and by said second pulses when said bistate means is set to said second state, a second gate circuit for applying said change pulses to increment said counter when said first control signal is produced, and a third gate circuit for applying said change pulses to decrement said counter when said second control signal is produced.

* * * * *